United States Patent [19]

Miyajima

[11] Patent Number: 4,924,178
[45] Date of Patent: May 8, 1990

[54] DRIVE APPARATUS FOR A CROSS COIL TYPE METER

[75] Inventor: Motoyasu Miyajima, Shimada, Japan

[73] Assignee: Yazaki Corporation, Tokyo, Japan

[21] Appl. No.: 299,109

[22] Filed: Jan. 19, 1989

[30] Foreign Application Priority Data

Jan. 22, 1988 [JP] Japan .................................. 63-10916

[51] Int. Cl.$^5$ ............................................. G01R 1/00
[52] U.S. Cl. ................................ 324/154 R; 324/143; 324/167
[58] Field of Search ............... 324/154 R, 140 R, 143, 324/144, 146, 151 A, 166, 167, 174, 171, 140 D, 111, 115; 307/254, 270, 515

[56] References Cited

U.S. PATENT DOCUMENTS

| | | | |
|---|---|---|---|
| 3,544,897 | 12/1970 | Simurda | 324/140 R X |
| 3,636,447 | 1/1972 | Gelenius | 324/140 R |
| 3,946,311 | 3/1976 | Baker et al. | |
| 4,051,434 | 9/1977 | Sweet | 324/166 X |
| 4,228,396 | 10/1980 | Palombo et al. | 324/171 X |
| 4,230,894 | 10/1980 | Taylor | |
| 4,371,834 | 2/1983 | Bezard et al. | 324/167 |
| 4,443,795 | 4/1984 | Fowler | 324/140 R |
| 4,742,297 | 5/1988 | Heaton et al. | 324/166 |
| 4,827,209 | 5/1989 | Tanaka et al. | 324/167 X |
| 4,841,238 | 6/1989 | Birch | 324/144 |

FOREIGN PATENT DOCUMENTS 58-2414 5/1983 Japan .

Primary Examiner—Reinhard J. Eisenzopf
Assistant Examiner—Robert W. Mueller
Attorney, Agent, or Firm—Armstrong, Nikaido, Marmelstein, Kubovcik & Murray

[57] ABSTRACT

A drive apparatus for a cross-coil type meter has cross-coils formed of a first and a second coil disposed intersecting at the center thereof. A magnet rotor is disposed in a magnetic field set up by the cross coils, and a measurement is represented in terms of a rotational angle of the magnet rotor. The drive apparatus comprises a first supply means for supplying the first coil with a first square wave current having a duty cycle of a% in accordance with the measurement; a second supply means for supplying the second coil with a second square wave current having a duty cycle of (100-a)% complementary to the first square wave current; and a polarity setting means for setting in accordance with the measurement polarities of the first square wave current and the second square wave current.

4 Claims, 3 Drawing Sheets

DRIVE APPARATUS FOR A CROSS COIL TYPE METER

BACKGROUND OF THE INVENTION

1. Field of the Invention

This invention relates to a drive apparatus for a cross-coil type meter having a magnet rotor and a pair of cross coils which are disposed in such a way that one is positioned at an angle with respect to the other, the magnetic field set up by cross coils causes the magnet to rotate, and measurement is displayed in terms of the rotational angle of the magnet rotor.

2. Description of Prior Art

Japanese Patent publication No. 62-16381 discloses one such type of conventional drive apparatus. A pair of coils are disposed to intersect at a right angle with respect to each other and a pointer is located at the intersecting point of the two coils. The pair of coils set up a magnetic field that causes a pointer to point an angular position in octants. Eight consecutive octants constitute a complete rotation (360 degrees in total) of the shaft or a magnet rotor. A drive current having a variable duty cycle in the range from 0 to 100% is allowed to flow through one of the coils in accordance with a quantity to be measured, while a current equal to the maximum value of the drive current is allowed to flow through the other coil, thereby determining an angular position of the pointer in an octant of the rotation of the magnet rotor. Thus the magnet rotor rotates an angle in accordance with the quantity to be measured so that the one can tell the measurement in terms of the angular position of the pointer. Selecting the polarity of the currents through the cross coils permits the pointer to deflect in a specified octant out of eight octants.

The above-mentioned prior art drive apparatus suffers from problems that a logic circuit for determining an octant in which the pointer is to deflect is of complexity as well as a pointer-zero-returning device such as a magnet or a hair spring etc. cause errors in indication since a unit drive current is assumed to accurately produce a unit angular positional displacement of the pointer. The present invention was made to overcome the aforementioned drawbacks.

SUMMARY OF THE INVENTION

Thus an object of the present invention is to provide a drive apparatus wherein means for determining the angular position of the pointer, e.g. rotational angle of a magnet, is simplified as well as the zero-returning devices etc. do not cause errors in the angular positions of the pointer.

A drive apparatus for a cross-coil type meter according to the present invention has a cross-coil formed of a first and a second coils which are disposed perpendicularly to each other intersecting at the center thereof, a magnet rotor is disposed in a magnetic field set up by the cross coils, and a measurement is represented in terms of a rotational angle of the magnetic rotor, wherein the drive apparatus comprises:

a first supply means for supplying the first coil with a first square wave current having a duty cycle of a% in accordance with the measurement;

a second supply means for supplying the second coil with a second square wave current having a duty cycle of (100-a)% complementary to the first square wave current; and a polarity setting means for setting polarities of the first square wave current and the second square wave current in accordance with the measurement.

By this arrangement, the magnet rotor can rotate in a specific quadrant out of four quadrants obtained by dividing one rotation of the magnet rotor. Additionally, the rotational angle of the magnet rotor in each quadrant is determined by the duty cycle of the first and second square wave currents through the first and the second coils.

BRIEF DESCRIPTION OF THE DRAWINGS

The above objects and other objects of the invention will be more apparent by the detailed description and the attached drawings in which.

DETAILED DESCRIPTION OF THE INVENTION

Figure 1A:
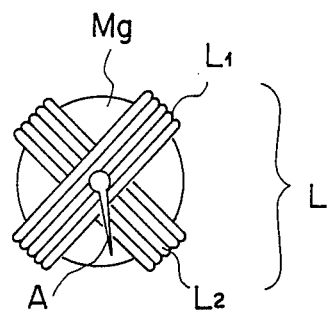
FIG. 1A and FIG. 1B show a top view and a perspective view, respectively, of a cross coil type meter according to the present invention.
Figure 1B:
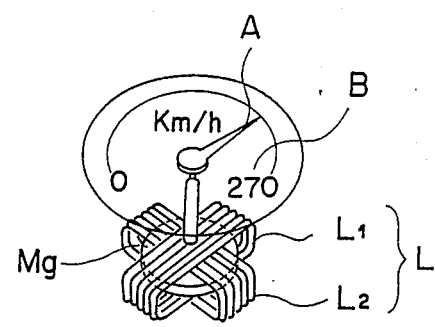

An embodiment of the invention will now be described with reference to the drawings as follows. FIG. 1A and FIG. 1B show a cross coil type meter according to the present invention. In the figures, a cross coil L is formed of a first coil L1 and a second coil L2 which are disposed to intersect at right angle to each other other, and a magnet rotor Mg is disposed rotatably in the magnetic field set up by the cross coil L. The magnet rotor Mg carries at the center thereof a pointer A. A plate B has, for example, a calibration thereon indicative of speds of a vehicle as shown and cooperates with the pointer A to indicate the quantity of a measurement or speed of the vehicle.

With this arrangement, current flowing through the first and second coils L1,L2 set up magnetic fields, respectively. The magnet rotor Mg rotates in such a way that the direction of magnetic pole of the magnet rotor Mg coincides with the direction of a resultant magnetic field resulted from the magnetic fields by the two coils. The direction of the resultant magnetic field is a vector sum of the respective magnetic fields produced by the first and second coils L1,L2 and its magnetic field strength is proportional to the current through the respective coils L1,L2. Thus the resultant vector (resultant magnetic field) produced by the current flowing through the respective coils in accordance with the quantity to be measured, causes the magnet rotor Mg to rotate in the direction thereof, which in turn causes the pointer A to rotate to an angle corresponding to the measurement, thereby the pointer indicating the quantity to be measured.

In the present invention, a first square wave current flows through the first coil L1, while a second square wave current having a duty cycle complementary to that of the first square wave current flows through the second coil L2. That is, the first square wave current of a duty cycle of a% ($0 < a < 100$) in accordance with the quantity to be measured is supplied to the first coil L1. While the second square wave current of a duty cycle of (100-a)% is supplied to the second coil L2.

Figure 2A:
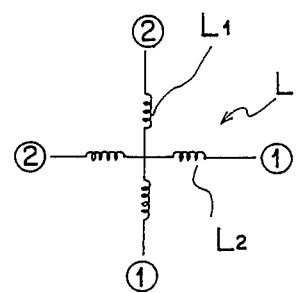
FIG. 2A and FIG. 2B show a range of rotation of the cross coil and a magnet rotor for illustrating the operation of the invention.
Figure 2B:
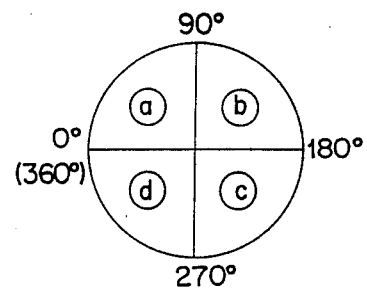

Angles pointed by the pointer A, caused by the rotation of the magnet rotor Mg, will now be described referring to the quadrants in FIG. 2. In the case where the magnet rotor rotates in the range from 0 to 90 degrees (quadrant a), in order for the magnet rotor Mg to rotate in the direction of 0 to 90 degrees, the first square wave current is caused to flow through the coil L1 from terminals 1 to 2 thereof, rotational angle of the rotor being increased with increasing duty cycle of a%; while the second square wave current is caused to flow through the coil L2 from terminals 1 to 2 thereof, the rotational angle of the rotor being increased with decreasing duty cycle of (100-a)%. The duty cycles of the first and second square wave currents vary in a fashion complementary to each other as mentioned above, in which the duty cycle of one square wave current increases with decreasing duty cycle of the other.

In the case where the magnet rotor rotates in the range from 180 to 270 degrees (quadrant c) and from 270 to 360 degrees (quadrant d), in order for the magnet rotor Mg to rotate in the direction of 90 to 180 degrees, the first square wave current is caused to flow through the coil L1 from the terminals 1 to 2 thereof, the rotational angle of the rotor being increased with decreasing duty cycle of a%; while the second square wave current is caused to flow through the coil L2 from the terminals 2 to 1 thereof, the rotational angle of the rotor being increased with increasing duty cycle of (100-a)%. In the case where the magnet rotor rotates in the range from 0 to 90 degrees (quadrant a), in order for the magnet rotor Mg to rotate in the direction of increasing rotational angle in each quadrant, the first square current is caused to flow through the coil L1 from the terminals 2 to 1 thereof, rotational angle being increased with increasing (decreasing) duty cycle of a%, and the second square current is caused to flow through the coil L2 from terminals 2 (1) to 1 (2) thereof, the rotational angle of the rotor being increasing with decreasing duty cycle of (100-a)% decreasing (increasing). The above operation can be represented in table 1 as follows.

TABLE 1

| Polarity setting | | Quadrants (deg.) | Direction of current through L1 and change in duty cycle Terminals 1  2 | | Direction of current through L2 and change in duty cycle Terminals 1  2 | |
|---|---|---|---|---|---|---|
| S1 | S2 | | | | | |
| 1 | 1 | a, (0-90) | increase→ | | decrease→ | |
| 1 | 0 | b, (90-180) | decrease→ | | | ←increase |
| 0 | 0 | c, (180-270) | | ←increase | | ←decrease |
| 0 | 1 | d, (270-360) | | ←decrease | increase→ | |

Arrows indicate direction of flow of currents between the terminals. The terms "increase" and "decrease" represent an increase and a decrease in duty cycles of the currents when angular position of the rotor increases.

For example, when S1, S2 are both "1", the angular position of the pointer or the rotor is in quadrant a, and increases with increasing duty cycle of the current through L1 in the direction from the terminal 1 to terminal 2 and with decreasing duty cycle of the current through L2 in the direction from the terminal 1 to 2.

In the respective quadrants from a to d, the deflection angle 0 of the pointer A is obtained by $0 = \tan^{-1}(I1/I2)$, where I1 and I2 are currents through the first and second coils L1 and L2. Then in the present invention, the duty cycles a% and (100-a)% of the first and second square wave currents, respectively, are set such that $0 = \tan^{-1}[a/(100-a)]$ is satisfied. That is, a specific quadrant from a to d in which the magnet rotor Mg is to be rotated is determined by setting the polarity i.e., direction of the square wave currents through the first and second coils L1,L2 in accordance with the size of the quantity to be measured. Then, a specific angle by which the magnet rotor Mg is to rotate in each of the aforementioned quadrants is determined in accordance with the duty cycle of the first and the second square wave currents complementary to each other. Operating in the manner thus far described, the magnet rotor Mg rotates in the range from 0 to 360 degrees in accordance with the quantity to be measured, thereby indicating the measurement.

Figure 3:
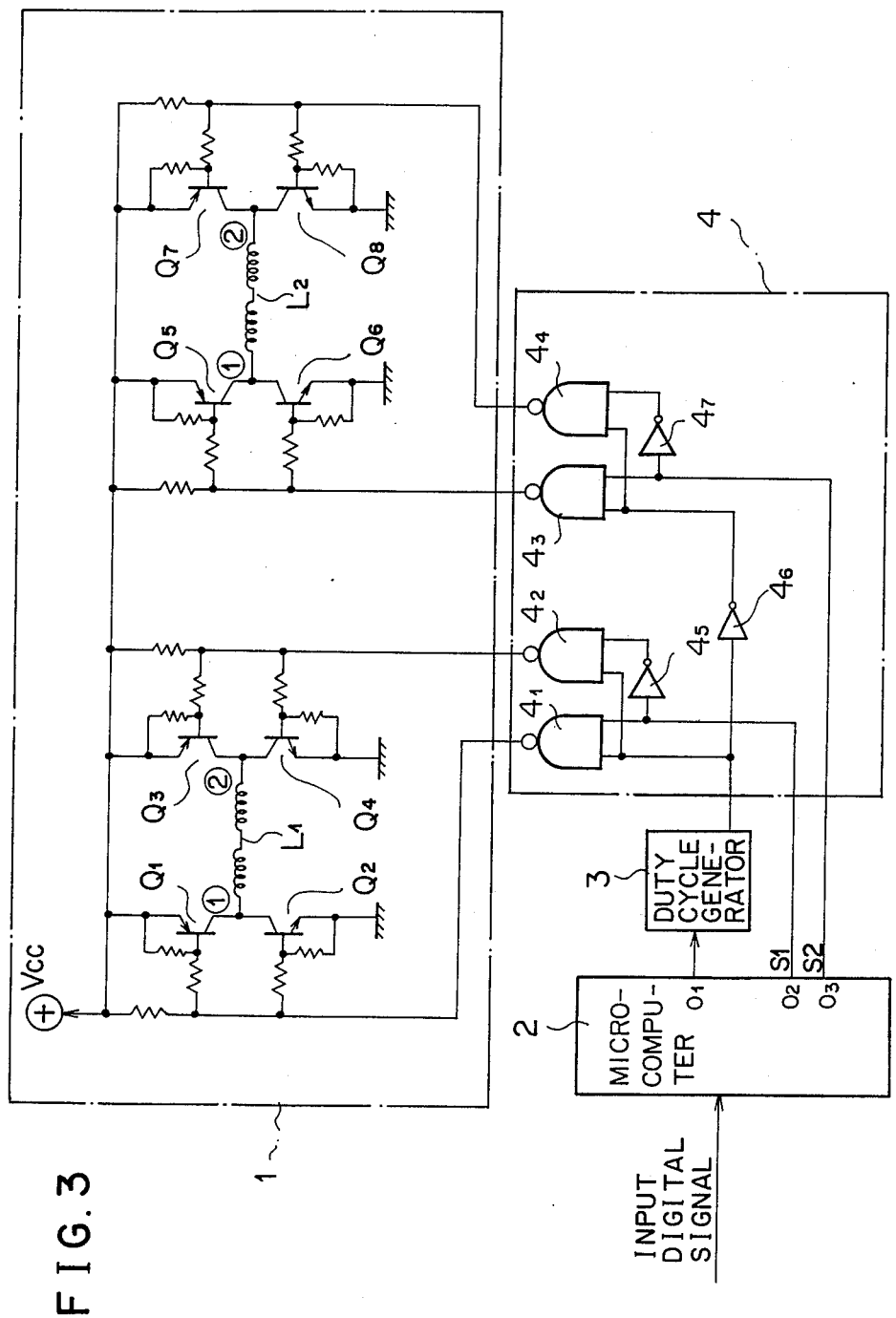
FIG. 3 shows an embodiment of a drive apparatus according to the present invention.

FIG. 3 shows an embodiment of a drive apparatus according to the present invention. In a drive circuit 1, a first coil L1 is connected between the mid point of a series circuit of a PNP transistor Q1 and an NPN transistor Q2 and the mid point of a series circuit of a PNP transistor Q3 and an NPN transistor Q4. Also a second coil L2 is connected between the mid point of a series circuit of a PNP transistor Q5 and an NPN transistor Q6 and the mid point of a series circuit of a PNP transistor Q7 and an NPN transistor Q8. A digital input signal indicative of the quantity to be measured is inputted to a microcomputer (referred to as CPU hereafter) 2. The data output from an output port $O_1$ drives a duty cycle generator 3. Output ports $O_2$ and $O_3$ provide polarity setting signals S1 and S2, respectively, which are inputted to a logic circuit 4.

The logic circuit 4 is constructed of NAND circuits $4_1$ to $4_4$ and inverter circuits $4_5$ to $4_7$. The logic circuit 4 is for supplying the first and second coils L1,L2 with the first and second square wave signals which are outputted from the duty cycle generator 3, the square wave currents being supplied with an appropriate polarity in accordance with the polarity setting signals S1,S2. The outputs of the respective NAND circuits are supplied to the bases of the respective pair of transistors Q1,Q2, Q3,Q4, Q5,Q6, and Q7,Q8.

The memory (ROM) in the CPU 2 stores a duty cycle access data table for accessing the duty cycle generator 3 in accordance with input digital signal and a table of the polarity setting data S1,S2 corresponding to the input digital signal. The duty cycle generator 3 is arranged to provide a square wave signal of a duty cycle in accordance with a duty cycle access data from the CPU 2.

As shown in table II(1) below, the ROM contains tables (1,1), (1,0), (0,0), and (0,1) for each of the polarity—setting data S1,S2 corresponding to the digital data in the ranges 0 to 89, 90 to 179, 180 to 260, and 270 to 360, assuming that, for example, a unit change "1" in the quantity to be measured corresponds to a rotational angle of "1" degree of the magnet rotor Mg. Also, as shown in table II(2), the ROM provides the duty cycle access data a0 to a360 necessary for the pointer to point angular positions ranging from 0 to 360 degrees for a given duty cycle of a%.

Then on the basis of the duty cycle access data obtained form this table, the duty cycle generator 3 outputs a corresponding square wave signal of a duty cycle of a%.

TABLE II(1)

| Input digital data | polarity setting data | |
|---|---|---|
| | S1 | S2 |
| 0 to 89 | 1 | 1 |
| 90 to 179 | 1 | 0 |
| 180 to 269 | 0 | 0 |
| 270 to 360 | 0 | 1 |

TABLE II(2)

| Input digital data | Duty cycle access data |
|---|---|
| 0 | a0 |
| . | . |
| . | . |
| . | . |
| 360 | a360 |

Figure 4:
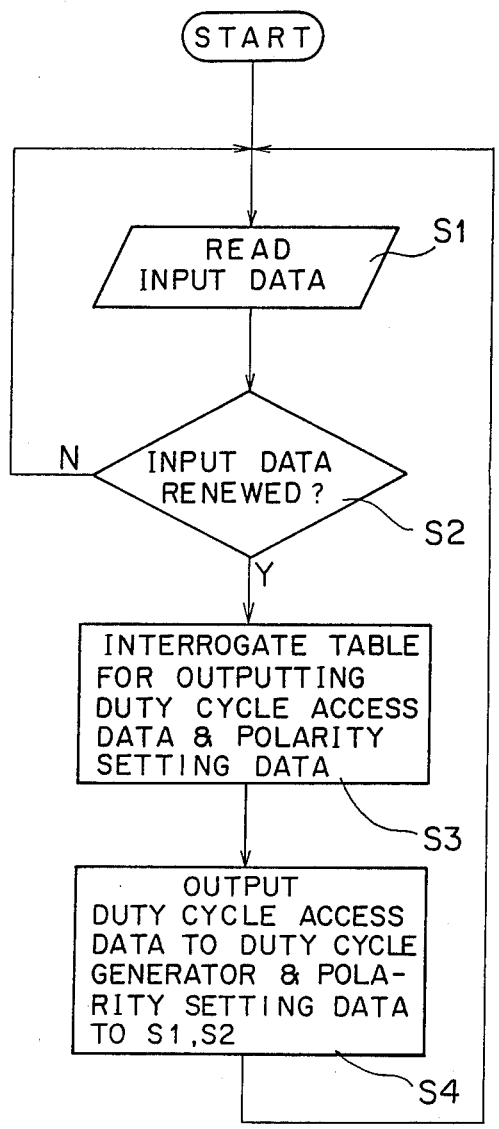
FIG. 4 illustrates a flowchart for showing data-processing by a CPU in FIG. 3.

The operation of the drive apparatus according to the invention will now be described with reference to a flowchart which illustrates the process of the CPU shown in FIG. 4. The CPU 2 reads in the input digital signal thereto at step S1 and then compares the input data just read in with a previous data at step S2. If the new data is different from the previous data (i.e., if the data has been renewed), the process proceeds to step S3 to search the respective tables, thereby determining the duty cycle access data and the polarity setting data S1,S2 in accordance with the input digital signal. Then the CPU outputs the duty cycle access data determined at step S4 to the duty cycle generator 3 to cause the generator 3 to output a square wave current of a duty cycle of a% in accordance with the input digital signal. The CPU 2 provides the polarity distinguishing data S1,S2 to the logic circuit 4. The data S1,S2 are directly inputted to one of the inputs of the 2-input NAND circuits 4$_1$ and 4$_3$, respectively. Also the data S1,S2 are inverted by 4$_5$ and 4$_7$, respectively, and are inputted to one of the inputs of the 2-input NAND circuits 4$_2$ and 4$_4$, respectively. Then each of the NAND circuits 4$_1$ to 4$_4$ provides logic outputs as shown in table III.

TABLE III

| Polarity setting data | | Outputs of NAND circuits | | | |
|---|---|---|---|---|---|
| S1 | S2 | 41 | 42 | 43 | 44 |
| 1 | 1 | L | H | L | H |
| 1 | 0 | L | H | H | L |
| 0 | 0 | H | L | H | L |
| 0 | 1 | H | L | L | H |

These logic outputs cause one of the serially-connected transistors Q1-Q2, Q3-Q4, Q5-Q6, and Q7-Q8 in the drive circuit 1 to become non-conductive and the other to become conductive, thereby setting the direction (polarity) of the square wave currents supplied to the first and second coils from a power supply Vcc. On the other hand, the duty cycle generator 3 outputs, on the basis of the outputs from the CPU 2, a square wave signal of a duty cycle of a% in accordance with the digital signal indicative of the size of the quantity to be measured. This square wave signal is outputted from the NAND circuits 4$_1$ or 4$_2$, causing the transistors Q1 or Q2, and Q3 or Q4 to perform switching operation. Thus the first coil L1 is supplied with the first square wave current of a duty cycle of a% from the supply line Vcc. In the mean time, the square wave signal from the duty cycle generator 3 is inverted by the inverter 4$_6$ to be outputted as a square wave signal of a duty cycle of (100-a)%. This square wave signal is outputted through the NAND circuits 4$_3$ or 4$_4$, causing the transistors Q5 or Q6, and Q7 or Q8 to perform switching operation. Thus the second coil L2 is supplied with the second square wave current of a duty cycle of (100-a)% from the supply line Vcc.

According to the drive apparatus described above, the ROM in the CPU 2 contains tables (e.g., TABLE II) in which the duty cycle access data in accordance with the input digital signal and the polarity setting data S1,S2 are stored; therefore even if non-linearity between the angular position of the pointer in the respective quadrants and the duty cycle exists due to the zero-returning device etc., the non-linearity can be easily compensated by modifying the content of the tables. Further, unlike a prior art octant-arrangement, the rotation of the magnet rotor is controlled in a quadrant-arrangement but not in an octant-arrangement, thereby providing easy setting of the polarity of the drive current and determining the angular position of the pointer in a specific quadrant by simply changing the duty cycle of the drive current as shown in TABLE I and II.

Recently, various signal data in the form of digital signals generated in a vehicle are supplied to an on-vehicle computer (CPU) and are processed by the computer; therefore most of the signals are displayed in a digital form. Despite the fact that signal processing in digital form has been very common in vehicles, many users still prefer to indication by an analog meter.

The present invention can be applied to indicate the speeds of the vehicles by such analog meters (cross coil type meters) in which the digital data are input to the CPU 2 as input data. Further, the CPU that has been provided on the vehicle can also serve as the CPU 2.

Let's consider, for example, when the vehicle runs at a speed of 27 km/h, a digital data in accordance with this speed is input to the CPU 2. Assuming that the speedometer is adapted to indicate 0 km/h at a position of 0 degree in FIG. 2B and an indication takes place at a position apart 27 degrees relative to the 0 degrees in a clockwise direction. The CPU interrogates the tables in the ROM to set the polarity setting data S1,S2 to "1", respectively. The CPU 2 also interrogates the tables to read a duty cycle access data of a duty cycle corresponding to a speedof 27 km/h, and causes the duty cycle generator 3 to output a square wave signal corresponding to the duty cycle access data. Thus the cross coil L is driven on the basis of the polarity distinguishing data S1,S2 and the square wave signals for causing the magnet rotor Mg to rotate by 27 degrees, which in turn permits the pointer A to indicate 27 km/h. The CPU 2 reads the digital data indicative of the vehicle speed at a predetermined intervals.

What is claimed is:

1. A drive apparatus for a cross-coil type meter having a cross-coil formed of a first coil and a second coil disposed in intersecting relation with respect to each other, a magnet rotor being disposed in a magnetic field set up by said cross-coil, and a measurement of an input to said meter being indicated in terms of an angle by which the magnet rotor rotates; wherein said drive apparatus comprises:

a first supply means for supplying said first coil with a first square wave current having a duty cycle of a% in accordance with said input to said meter;
 a second supply means for supplying said second coil with a second square wave current having a duty cycle of (100-a)% complementary to said first square wave current; and a polarity setting means for setting polarities of said first square wave current provided by said first supply means and of said second square wave current provided by said second supply means in accordance with said input to said meter.

2. The drive apparatus of claim 1, wherein said first supply means includes a first pnp transistor, a second npn transistor, a third pnp transistor, and a fourth npn transistor arranged such that when said first pnp transistor and said fourth npn transistor conduct, said first coil is energized with a first polarity, and when said second npn transistor and said third pnp transistor conduct, said first coil is energized with a polarity opposite said first polarity.

3. The drive apparatus of one of claims 1 or 2, wherein said second supply means includes a fifth pnp transistor, a sixth npn transistor, a seventh pnp transistor, and an eighth npn transistor arranged such that when said fifth pnp transistor and said eighth npn transistor conduct, said second coil is energized with a first polarity, and when said sixth npn transistor and said seventh pnp transistor conduct, said second coil is energized with a polarity opposite said first polarity.

4. The drive apparatus of claim 3, wherein said polarity setting means comprises:

a first pair of NAND gates connected to said first supply means, wherein an output of one of said first pair of NAND gates is operatively connected to the bases of said first pnp and second npn transistors, and an output of the other of the first pair of NAND gates is operatively connected to the bases of said third pnp and fourth npn transistors; and a second pair of NAND gates connected to said second supply means, wherein an output of one of said second pair of NAND gates is operatively connected to the bases of said fifth pnp and sixth npn transistors, and an output of the other of said second pair of NAND gates is operatively connected to the bases of said seventh pnp and eighth npn transistors, such that said first and second pairs of NAND gates drive the first and second supply means complementarily so that said first supply means has a duty cycle complementary to said second supply means.

* * * * *